United States Patent [19]

Motokawa

[11] Patent Number: 5,004,701
[45] Date of Patent: Apr. 2, 1991

[54] METHOD OF FORMING ISOLATION REGION IN INTEGRATED CIRCUIT SEMICONDUCTOR DEVICE

[75] Inventor: Kazumasu Motokawa, Yamaguchi, Japan

[73] Assignee: NEC Corporation, Japan

[21] Appl. No.: 303,721

[22] Filed: Jan. 27, 1989

[30] Foreign Application Priority Data

Jan. 29, 1988 [JP] Japan .................................. 63-19984

[51] Int. Cl.[5] ............................................ H01L 21/76
[52] U.S. Cl. ...................................... 437/47; 437/48; 437/52; 437/69; 437/70; 437/26
[58] Field of Search ...................... 437/63, 69, 70, 26, 437/28, 41, 47, 48, 52

[56] References Cited

U.S. PATENT DOCUMENTS

| | | | |
|---|---|---|---|
| 4,608,751 | 9/1986 | McElroy | 357/23.6 |
| 4,679,303 | 7/1987 | Chen et al. | 357/23.12 |
| 4,731,642 | 3/1988 | Katto et al. | 357/45 |

FOREIGN PATENT DOCUMENTS

| | | | |
|---|---|---|---|
| 53-33053 | 3/1978 | Japan | 437/70 |
| 53-129591 | 11/1978 | Japan | 437/28 |
| 54-58381 | 5/1979 | Japan | 437/70 |
| 55-121665 | 9/1980 | Japan | 437/70 |
| 56-105651 | 8/1981 | Japan | 437/69 |
| 58-192348 | 11/1983 | Japan | 437/63 |
| 59-75643 | 4/1984 | Japan | 437/70 |
| 63-293850 | 11/1988 | Japan | 437/70 |
| 1-22069 | 1/1989 | Japan | 437/52 |

OTHER PUBLICATIONS

Nishiyama et al., JP. J. Appl. Phys. v. 19, No. 10 (Oct. 1980), pp. L563–L566.

*Primary Examiner*—Olik Chaudhuri
*Attorney, Agent, or Firm*—Laff, Whitesel, Conte & Saret

[57] ABSTRACT

A method of manufacturing an isolation region including a field oxide layer and a channel stopper impurity region is disclosed. The channel stopper impurity region is formed after forming the field oxide layer by introducing ions of impurity at a portion of the substrate through the field oxide layer by ion-implantation manner.

7 Claims, 3 Drawing Sheets

METHOD OF FORMING ISOLATION REGION IN INTEGRATED CIRCUIT SEMICONDUCTOR DEVICE

FIELD OF THE INVENTION

The present invention relates to a method of forming an isolation region in an integrated circuit semiconductor device, and more particularly to a method of forming a channel stopper region constituting the isolation region with a field oxide layer between circuit elements.

Heretofore, an isolation region for isolating circuit elements each other has been formed in a semiconductor substrate by such a method that at first impurities of the same conductivity type as the surface of the substrate are selectively introduced by thermal diffusion manner, ion-implantation manner, etc. into the surface of the field region of the substrate, and thereafter, the substrate is subjected to a heat treatment under an oxidizing atmosphere at a high temperature during a long time to form selectively the field oxide layer having a thick thickness and at least partially embedded into the substrate from the surface thereof. The mask member using in the selective introduction of the impurities and the mask member using in the selective formation of the field oxide layer have the same mask pattern, each other. Therefore, the channel stopper region is entirely formed under the field oxide layer. In this case, the channel stopper region having a high impurity concentration is inevitably directly contacted to an impurity region of a conductivity type opposite to the channel stopper region in the circuit element thereby enhancing unfavorably a parasitic PN junction capacitance of the circuit element and decreasing unfavorably the operation speed of the circuit element and/or of the semiconductor device. On the other hand, even if the impurities are introduced at a portion of the field region on which the field oxide layer is entirely formed, the same problems would be caused because the impurities introduced beforehand are laterally diffused in a relatively large distance during the heat treatment of the long time for forming the thick field oxide layer.

SUMMARY OF THE INVENTION

Accordingly, it is an object of the present invention to provide a method of forming an isolation region in an integrated circuit semiconductor device by which the channel stopper region can be formed in a predetermined portion under the field oxide layer so that the channel stopper region is not unfavorably contacted to the impurity region of the circuit element.

According to a feature of the present invention, there is provided a method of manufacturing an isolation region in an integrated circuit semiconductor device comprising the steps of forming a first mask pattern made of anti-oxidation material such as silicon nitride on a surface of a semiconductor substrate of one conductivity type such as P-type silicon substrate, forming selectively a field oxide layer by a heat treatment under oxidizing atmosphere on a field region of the substrate between first and second circuit element forming regions of the substrate by using the first mask pattern as a mask, forming a second mask pattern made of, for example, photoresist film on the substrate including the field oxide layer, thereafter, introducing ions of impurity of the one conductivity type such as boron ions by ion-implantation into a portion of the substrate under a part of the field oxide layer through the field oxide layer by using the second mask pattern as a mask, carrying out an activation of the impurities by annealing to form a channel stopper region of the one conductivity type having a higher impurity concentration than the substrate at the portion of the substrate abutted against the bottom of the part of the field oxide layer, and forming first and second circuit elements in the first and second circuit element forming regions of the substrate, respectively. When the semiconductor substrate is a P-type silicon substrate and its bulk boron (impurity) concentration ranges from $5 \times 10^{14}$ to $2 \times 10^{15}$ cm$^{-3}$, that is, its specific resistivity ranges from about 5 to 20 $\Omega$·cm, boron ions are implanted through the field silicon oxide layer of 5000 to 8000 Å thickness by ion implantation at the energy of 800 to 1000 KeV by the dosage of $0.5 \times 10^{12}$ to $6 \times 10^{13}$ cm$^{-2}$, for example. By the annealing for activating the implanted borons, the channel stopper region having the boron concentration of $1 \times 10^{16}$ to $3 \times 10^{17}$ cm$^{-3}$ and the depth of 0.5 to 2.0 $\mu$m from the bottom of the part of the field silicon oxide layer may be formed under the bottom such that it is attached to the bottom and separated by the same distance of, for example, 0.5 $\mu$m from both side edges of the field silicon oxide layer.

Accordingly, the channel stopper region of the present invention can be precisely positioned at a desired portion of the field region of the substrate. Consequently, the parasitic PN junction capacitance of the circuit element can be reduced and the operation speed of the device can be enhanced.

Additional objects and features of the invention will be appear from the following description in which the preferred embodiment is set forth in detail in conjunction with the accompanying drawings.

DESCRIPTION OF A PRIOR ART

Figure 1:
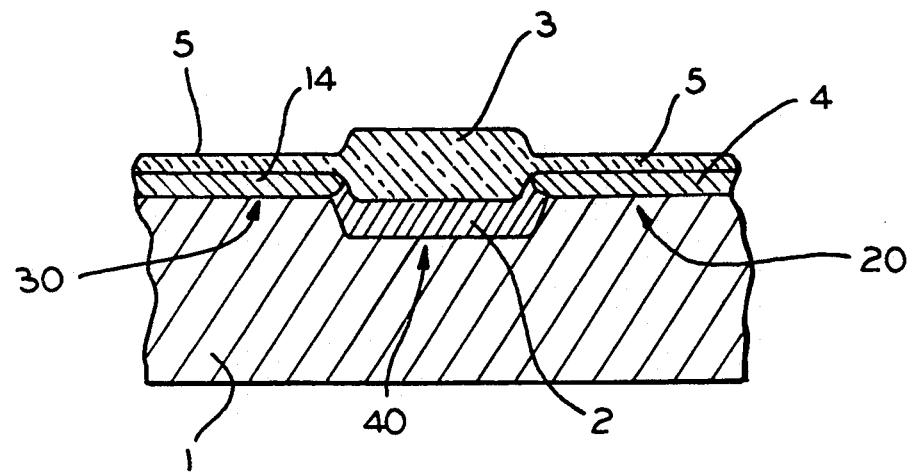
FIG. 1 is a partial cross-sectional view showing an integrated circuit semiconductor device manufactured by a conventional method.

Referring to FIG. 1, an isolation region consisting of a thick field silicon layer 3 and a P+-type channel stopper region 2 is formed on a field region 40 of a P-type silicon substrate 1 between element forming regions 20, 30 of the substrate. The isolation region is formed by a method comprising a first step for forming selectively the P+-type channel stopper region 2 on the field region 40 and a second step for forming selectively the thick field silicon oxide layer 3 after the first step through thermal oxidation on the field region 40. The selective formings in the first and second process steps are carried out by using the same mask pattern, for example, a nitride mask film pattern each other. Therefore, the P+-type channel stopper region 2 is formed under the entire bottom of the field silicon oxide layer 3 and protruded at both side surface portions of the layer 3. Consequently, the P+-type channel stopper region 2 is contacted to an N+-type impurity region 4 covered by a thin silicon oxide film 5, formed in the element forming region 20 and constituting a first circuit element, and also to an N+-type impurity region 14 covered by the thin silicon oxide film 5, formed in the element forming region 30 and constituting a second circuit element.

DETAILED DESCRIPTION OF EMBODIMENTS

Figure 2:
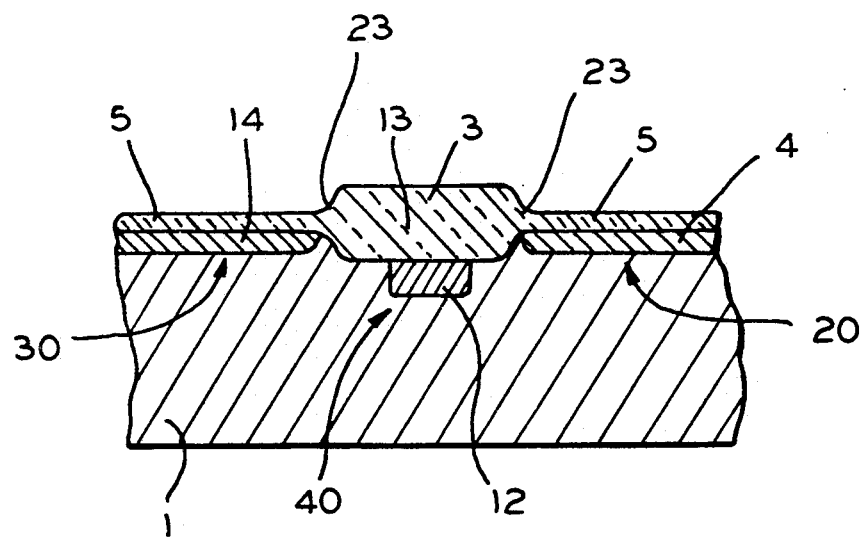
FIG. 2 is a partial cross-sectional view showing an integrated circuit semiconductor device manufactured by a method according to an embodiment of the present invention.

According to the present invention, after forming the thick field silicon oxide layer, a P+-type channel stopper region is formed by ion-implantation of P-type impurity ions such as boron ions through the field silicon oxide layer using another mask member as a mask. Therefore, as shown in FIG. 2, the P+-type channel stopper region 12 can be formed only under a center part of the field silicon oxide layer 3 separated from the sides 23 of the layer 3 which are contacted to the circuit element forming regions 20, 30.

Referring to FIGS. 3A to 3F, a method according to an embodiment of the present invention will be explained. In FIGS. 2 and 3A to 3F, the same components as those in FIG. 1 are indicated by the same reference numerals.

Figure 3A:
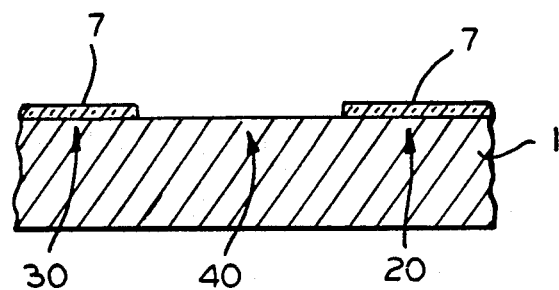
FIGS. 3A to 3F are partial cross-sectional views showing process steps in sequence according to the embodiment of the present invention.
Figure 3B:
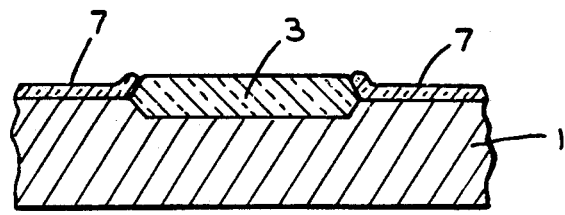
Figure 3C:
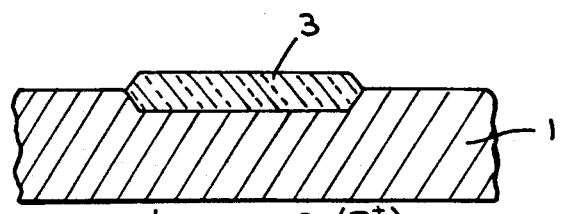
Figure 3D:
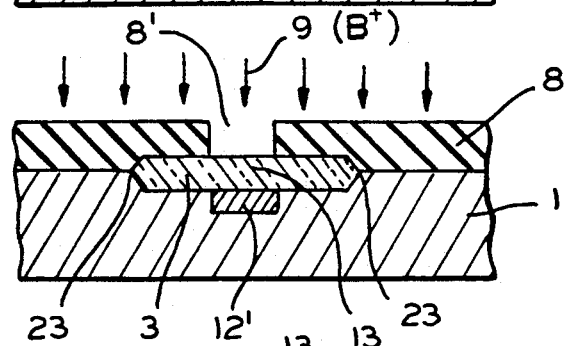
Figure 3E:
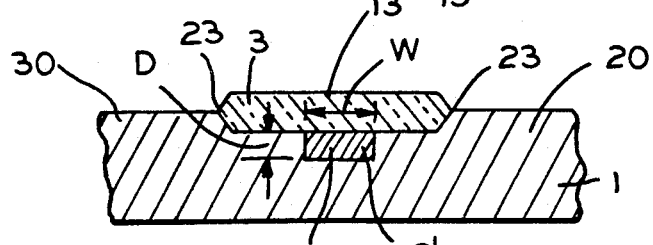
Figure 3F:
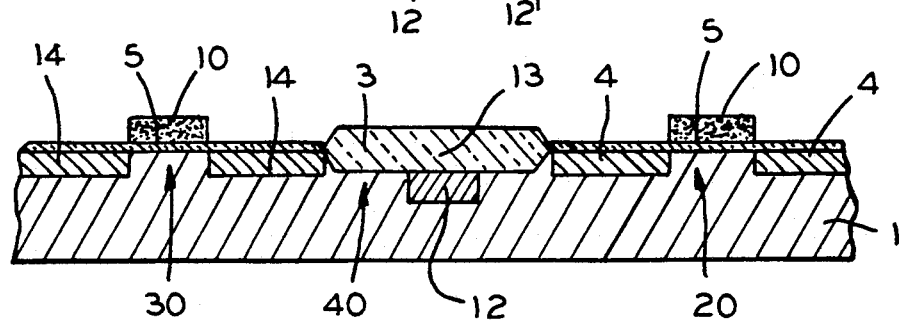

At first, as shown in FIG. 3A, a mask pattern 7 of silicon nitride film having the thickness of 1000 Å is formed on the major surface of the P-type silicon substrate (wafer) 1 having a bulk impurity (boron) concentration ranging from $5 \times 10^{14}$ to $2 \times 10^{15}$ cm$^{-3}$ such that the silicon nitride film covers the element forming regions 20, 30 and not cover the field region 40. The silicon nitride film pattern 7 may be formed on the surface of the substrate via a thin silicon oxide film of 500 Å thickness (not shown). Next, a heat-treatment is carried out at 1000° C. temperature, under an oxidizing atmosphere such as oxygen or steam during 4 hours to form selectively the field silicon oxide layer 3 having the thickness of 5000 to 8000 Å by using the silicon nitride film pattern 7 as the mask (FIG. 3B), and thereafter, the silicon nitride mask film pattern 7 is removed (FIG. 3C). Next, a photoresist mask pattern 8 of 2 to 3 μm thickness is formed on the substrate including the field silicon oxide layer 3, and then boron ions 9(B+) are implanted by an ion-implantation method into a portion 12' of the substrate under a part 13 of the field silicon oxide layer 3 separated from the side edges 23 thereof penetrating through the part 13, which is positioned under an aperture 8' of the photoresist pattern mask 8, of the field silicon oxide layer at the dosage ranging from $0.5 \times 10^{12}$ to $6 \times 10^{13}$ cm$^{-2}$, for example, of $6 \times 10^{12}$ cm$^{-2}$ with the energy ranging from 800 to 1000 KeV by using the photoresist pattern 8 as the mask (FIG. 3D). Next, the photoresist pattern 8 is removed by exposing it in plasma atmosphere of 900 watts during 120 minutes and immersing it in $H_2SO_4 \cdot H_2O_2$ solution. Then, an annealing heat treatment is carried out so as to place the implanted boron into electrically active sites so that the boron acts as an acceptor, that is, activation of the implanted boron. Consequently, the P+-type channel stopper region 12 by the implanted borons is formed in the section 12' of the substrate 1 under the center part 13 of the thick silicon oxide layer 3 in the widthwise direction between adjacent circuit element forming regions 20, 30 (FIG. 3E). The P+-type channel stopper region 12 has the boron concentration ranging from $1 \times 10^{16}$ to $3 \times 10^{17}$ cm$^{-3}$, for example, of $4 \times 10^{16}$ cm$^{-3}$, and has the depth D ranging from 0.5 μm to 2.0 μm, for example, of 1.5 μm. Further, the region 12 of 1.0 μm width W is remoted by the same distance of 0.5 μm from the both side edges 23 when width of the field region, that is, the width of the field silicon oxide layer is 2.0 μm. The annealing heat treatment for activating implanted borons may be conducted by a lamp anneal such as Xe flash lamp anneal or infrared radiation anneal in which the implanted surface region of the substrate is heated by irradiating incoherent light through the silicon oxide layer during 50 to 60 seconds, or else may be conducted by a resistance heating furnace under nitrogen atmosphere at 1000° C. during 1 hour. In both cases, the heating time for the annealing is far shorter than the heating time for forming the field silicon oxide layer 3, and therefore, the implanted borons are not unfavorably laterally diffused during the annealing. Next, as shown in FIG. 3F, after forming polycrystalline silicon gates 10 via gate silicon oxide films 5, source and regions 4, 14 of insulated gate field effect transistors are formed in respective circuit element forming regions 20, 30 of the substrate by arsenic ion implantation with a low energy using the gate electrodes 10 and the field silicon oxide layer 3 as the mask followed by a lamp annealing during 10 seconds or less or by a restance heating furnace annealing at 1000° C., under nitrogen atmosphere and during 10 minutes. In the embodiment, the silicon nitride film 7 is removed in the process step shown in FIG. 3C. However, the silicon nitride film 7 can remain till the process step shown in FIG. 3F such that the silicon nitride film pattern 7 is provided under the photoresist mask pattern 8 during the boron ion implantation.

Figure 4A:
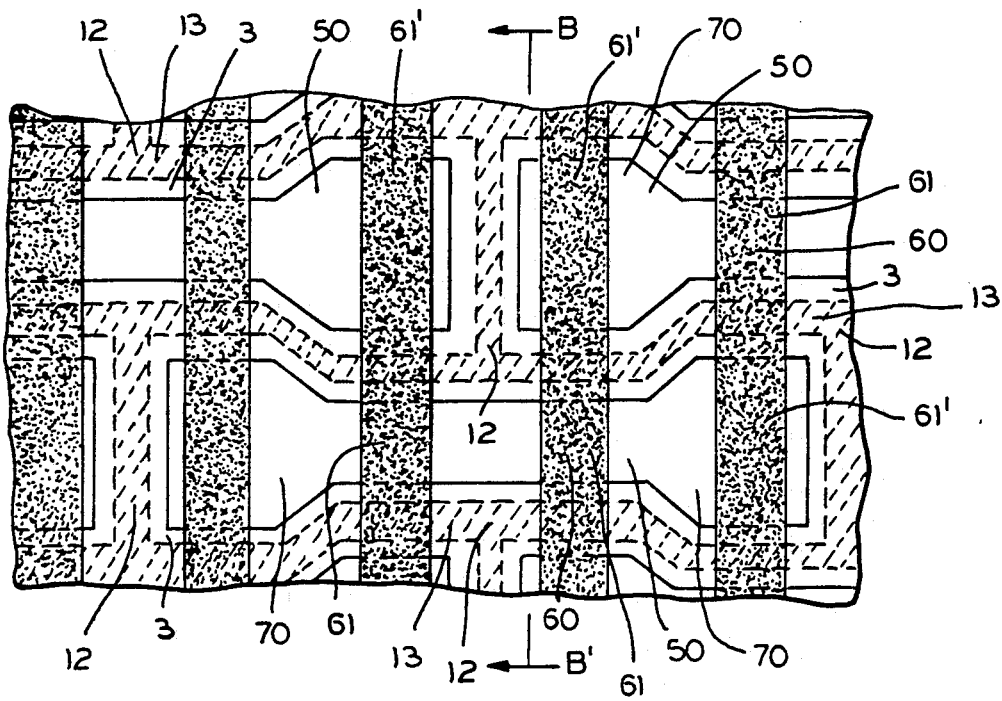
FIG. 4A is a partial plan view showing a dynamic random access memory (DRAM) device manufactured by the embodiment of the present invention.
Figure 4B:
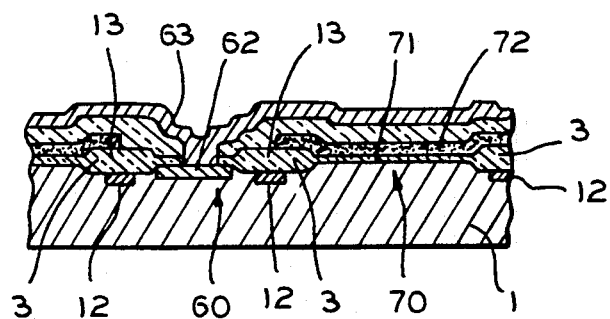
FIG. 4B is a cross-sectional view taken along lines B—B' in FIG. 4A as viewed in the direction of arrows.

Referring to FIGS. 4A, 4B, the field silicon oxide layer 3 and the P+-type channel stopper region 12 are formed by the same process steps shown in FIGS. 3A to 3E. In FIG. 4A, the P+-type channel stopper region 12 of the present invention is represented by right-upward dot hatching. The field silicon oxide layer 3 surrounds and be adjacent to a plurality of circuit element forming regions 50 having collar-borne like plan shape such that the layer 3 delineates each of regions 50. In each region 50, a pair of memory cells each having a transfer gate transistor 60 and a storage capacitor 70 are formed. The transistor 60 includes a N+-type common source or drain region 62 to which a bit line 63 is connected, and a gate electrode 61 on a channel region via a gate insulating film (not shown) continuously formed with a word line 61', and the storage capacitor 70 includes a dielectric film 71 and a capacitor electrode 72. To avoid complexity, the N+-type impurity region 62, the bit line 63, the dielectric film 71 and the capacitor electrode 72 in FIG. 4B are not shown in FIG. 4A. The P+-type channel stopper region 12 of the present invention is formed under a center part 13 of the field silicon oxide layer 3 in the widthwise direction between the adjacent circuit element forming regions 50 such that the P+-type channel stopper region 12 surrounds each of the regions 50 but separated from the regions 50. Therefore, an unfavorable connecting between the P+-type channel stopper region 12 and a section of the memory cell, such as, the N+-type impurity region 62 is not caused thereby enhancing the operation speed without increasing the parasitic PN junction capacitance.

Figure 5:
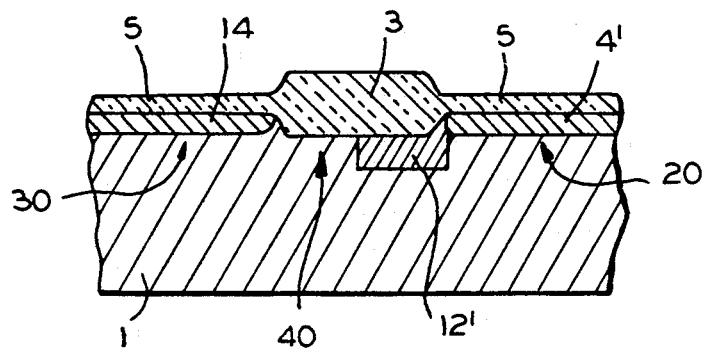
FIG. 5 is a partial cross-sectional view showing an integrated circuit semiconductor device manufactured by a method modified from FIGS. 3A to 3E.

Referring to FIG. 5, the same components as those in FIGS. 2, 3 are indicated by the same reference numerals. When an operation speed of a circuit element including an N+-type impurity region 4' and formed in the circuit element forming region 20 is not so important in comparison with that of a circuit element including the N+-type impurity region 14 and formed in the circuit element forming region 40, a P+-type channel stopper region 12' is formed by implanting boron ions through the field silicon oxide layer 3 by ion implantation method followed by an annealing heat treatment for activation of the implanted borons such that the P+-type channel stopper region 12' is predominately separated from the N+-type impurity region 14 and be contacted to the N+-type impurity region 4' by modifying the photoresist mask pattern 8 in FIG. 3D. The embodiment is favorable in case of different kinds of circuit elements being adjacent by interposing the isolation region and more high integration of device being necessary.

What is claimed is:

1. A method of manufacturing an isolation region in an integrated circuit semiconductor device comprising the steps of forming a first mask pattern made of antioxidant material on a surface of a semiconductor substrate of one conductivity type, forming selectively a field oxide layer by a heat treatment under an oxidizing atmosphere on a field region of said substrate between first and second circuit element forming regions of said substrate by using said first mask pattern as a mask, forming a second mask pattern on said substrate including said field oxide layer, thereafter, introducing ions of impurity of said one conductivity type by ion-implantation into a portion of said substrate under a part of said field oxide layer through said field oxide layer by using said second mask pattern as a mask, carrying out a first lamp annealing during a first time period for an activation of said implanted impurities of said one conductivity type to form a channel stopper region of said one conductivity type having a higher impurity concentration than said substrate in said portion of said substrate abutted against the bottom of said part of said field oxide layer wherein said portion of said substrate forming said channel stopper region is separated from said first circuit element forming region by a first distance and from said second circuit element forming region by a second distance which is substantially the same value as said first distance.

2. A method of manufacturing an isolation region in an insulated circuit semiconductor device of claim 1, in which said semiconductor substrate is a P-type silicon substrate having a boron concentration ranging from $5 \times 10^{14}$ to $2 \times 10^{15}$ cm$^{-3}$, and said channel stopper region has a boron concentration ranging from $1 \times 10^{16}$ to $3 \times 10^{17}$ cm$^{-3}$ and the depth from said bottom of said field oxide layer ranging from 0.5 to 2.0 μm.

3. A method of manufacturing an isolation region in an integrated circuit semiconductor device of claim 1, in which said semiconductor substrate is a P-type silicon substrate and said ions of impurity are boron ions.

4. A method of manufacturing an isolation region in an integrated circuit semiconductor device of claim 1, in which said second mask pattern is made of a photoresist film.

5. A method of manufacturing an isolation region in an integrated circuit semiconductor device of claim 1, wherein ions of impurity of a conductivity type opposite to said one conductivity type are introduced in first and second circuit element forming regions of said substrate.

6. A method of manufacturing an isolation region in an integrated circuit semiconductor device of claim 1, in which said device is a dynamic random access memory device having a plurality of random access memory cells as said circuit elements and a plurality of circuit element forming regions arranged in said substrate and surrounded by said field oxide layer of said isolation region, respectively such that each of said circuit element forming regions is delineated by said field oxide layer, and said channel stopper region is partially provided under a center part of said field oxide layer in the widthwise direction between adjacent circuit element forming regions so as to separate from every circuit element forming region and surrounds each of said circuit element forming regions.

7. A method of manufacturing an isolation region in an insulated circuit semiconductor device of claim 1, in which said ions of impurity are boron ions, and said ion-implantation is carried out at an energy ranging from 800 KeV to 1000 KeV.

* * * * *